United States Patent
Chen et al.

(10) Patent No.: US 7,399,674 B2
(45) Date of Patent: Jul. 15, 2008

(54) METHOD OF FABRICATING NAND-TYPE FLASH EEPROM WITHOUT FIELD OXIDE ISOLATION

(75) Inventors: Ming-Shang Chen, Hsinchu (TW); Wen-Pin Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 245 days.

(21) Appl. No.: 10/971,465

(22) Filed: Oct. 22, 2004

(65) Prior Publication Data

US 2006/0086968 A1    Apr. 27, 2006

(51) Int. Cl.
*H01L 21/8247*    (2006.01)

(52) U.S. Cl. .............................. 438/264; 257/E27.179
(58) Field of Classification Search ......... 438/257–267, 438/275; 257/E21.179
See application file for complete search history.

(56) References Cited

U.S. PATENT DOCUMENTS

| | | | |
|---|---|---|---|
| 5,486,480 A | * | 1/1996 | Chen ........................... 438/257 |
| 5,512,504 A | | 4/1996 | Wolstenholme et al. |
| 6,376,876 B1 | | 4/2002 | Shin et al. |

* cited by examiner

*Primary Examiner*—Richard A. Booth
(74) *Attorney, Agent, or Firm*—Stout, Uxa, Buyan & Mullins, LLP

(57) ABSTRACT

Methods are described for fabricating NAND-type EEPROMs without field oxide isolation. P+ implantations are employed to isolate adjacent memory cells.

9 Claims, 13 Drawing Sheets

METHOD OF FABRICATING NAND-TYPE FLASH EEPROM WITHOUT FIELD OXIDE ISOLATION

BACKGROUND OF THE INVENTION

1. Field of the Invention

The present invention relates generally to semiconductor fabrication methods and, more particularly, to fabrication of NAND-type flash EEPROMS without field oxide isolation.

2. Description of Related Art

A non-volatile semiconductor memory device is designed to maintain programmed information even in the absence of electrical power. Read only memory (ROM) is a non-volatile memory commonly used in electronic equipment such as microprocessor-based digital electronic equipment and portable electronic devices.

ROM devices typically include multiple memory cell arrays. Each memory cell array may be visualized as including intersecting word lines and bit lines. Each word and bit line (or bit line pair) intersection can correspond to one bit of memory. In mask programmable metal oxide semiconductor (MOS) ROM devices, the presence or absence of an active MOS transistor at word and bit line intersections distinguishes between a stored logic '0' and logic '1'.

A programmable read only memory (PROM) is similar to mask programmable ROM except that a user may store data values (i.e., program the PROM) using a PROM programmer. A PROM device is typically manufactured with fusible links at all word and bit line intersections. This corresponds to having all bits at a particular logic value, typically logic '1'. The PROM programmer is used to set desired bits to the opposite logic value, typically by applying a high voltage that vaporizes the fusible links corresponding to the desired bits. A typical PROM device can only be programmed once.

An erasable programmable read only memory (EPROM) is programmable like a PROM, but can also be erased (e.g., to an all logic '1's state) by exposing it to ultraviolet light. A typical EPROM device has a floating gate MOS transistor at word and bit line intersections. Each MOS transistor has two gates: a floating gate and a non-floating or control gate. The floating gate is not electrically connected to any conductor, and is surrounded by a high impedance insulating material. To program the EPROM device, a high voltage is applied to the non-floating gate at each bit location where a logic value (e.g., a logic '0') is to be stored. This causes a breakdown in the insulating material and allows a negative charge to accumulate on the floating gate. When the high voltage is removed, the negative charge remains on the floating gate. During subsequent read operations, the negative charge prevents the MOS transistor from forming a low resistance channel between a drain bit line and a source bit line (i.e., from turning on) when the transistor is selected.

An EPROM integrated circuit is normally housed in a package having a quartz lid, and the EPROM is erased by exposing the EPROM integrated circuit to ultraviolet light passed through the quartz lid. The insulating material surrounding the floating gates becomes slightly conductive when exposed to the ultraviolet light, allowing the accumulated negative charges on the floating gates to dissipate.

A typical electrically erasable programmable read only memory (EEPROM) device is similar to an EPROM device except that individual stored bits may be erased electrically. The floating gates in an EEPROM device are surrounded by a much thinner insulating layer, and accumulated negative charges on the floating gates can be dissipated by applying a voltage having a polarity opposite that of the programming voltage to the non-floating gates.

A relatively recent development in non-volatile memory is localized trapped charge devices. While these devices are sometimes referred to as nitride read only memory (NROM) devices, the acronym "NROM" is a part of a combination trademark of Saifun Semiconductors Ltd. (Netanya, Israel).

EEPROM arrays can be fabricated in either NOR or NAND configurations. The NAND configuration, which typically comprises parallel strings of memory cells connected in series, source-to-drain (NAND strings), may be preferred over the NOR configuration because of economy in the use of semiconductor real estate. Fabrication of NAND-type EEPROM arrays normally requires that isolation be provided between NAND strings in order that potentials applied to program a given cell do not influence the program state of neighboring EEPROM cells. Field oxide formed in a substrate between NAND strings may be used to provide the needed isolation. Shallow trench isolation (STI) may be employed as well. Field oxide and STI normally are formed before cell threshold voltage adjustment can be done. Including field oxide isolation in the design of EEPROM arrays may contribute undesirably to an increase in the thickness of individual cells, making it relatively difficult to fabricate flat arrays. Both STI and field oxide may consume substrate area that would be better utilized to provide a greater number of memory cells. That is, the requirement for field oxide isolation regions or STI in EEPROM arrays wastes semiconductor area and contributes to a decrease in the density of EEPROM arrays.

A need thus exists in the prior art for an EEPROM array without field oxide isolation regions. A further need exists for an EEPROM array without shallow trench isolation.

SUMMARY OF THE INVENTION

The present invention addresses these needs by providing methods for fabricating a NAND-type flash EEPROM without field oxide isolation. The invention herein disclosed provides, in an exemplary embodiment, a substrate doped with a first impurity type in which an implantation of the first impurity type is performed in order to control a desired threshold voltage of a memory cell. A tunnel oxide layer is formed on the substrate, a first floating gate layer is deposited on the tunnel oxide layer, and a first isolation layer is deposited on the first floating gate layer. A plurality of parallel regions is then etched in the first isolation layer and the first floating gate layer, the parallel regions being oriented in a reference direction and exposing portions of the tunnel oxide layer. A dopant of the first impurity type is then implanted into the substrate under the exposed portions of the tunnel oxide layer, forming a plurality of parallel electrical isolation regions in the substrate. A second isolation layer may be deposited to overlie the first isolation layer and the exposed portions of the tunnel oxide layer. A portion of the second isolation layer that overlies the first isolation layer then may be removed, and the first isolation layer then removed as well. A second floating gate layer may be deposited on the first floating gate layer, and a portion of the second floating gate layer that overlies the second isolation layer may be removed to expose a portion of the second isolation layer. An oxide-nitride-oxide (ONO) layer may then be formed on the second floating gate layer and the exposed portion of the second isolation layer. A layer of conducting material may be deposited on the ONO layer to form a control gate layer. After a re-oxidation step, a plurality of parallel regions of the control gate layer, the ONO layer, the second floating gate layer, the first floating gate layer, and the second isolation layer is etched to expose a plurality of parallel regions of the tunnel oxide layer. The parallel regions of the tunnel oxide layer are oriented in a direction substantially at a right angle to the reference direction. A dopant of a second impurity type is then implanted into the substrate under the exposed portions of the tunnel oxide layer to form a plurality of source/drain regions. In an exemplary embodiment, a dopant of the first impurity type may be a p-type dopant, and a dopant of the second impurity type may be an n-type dopant.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
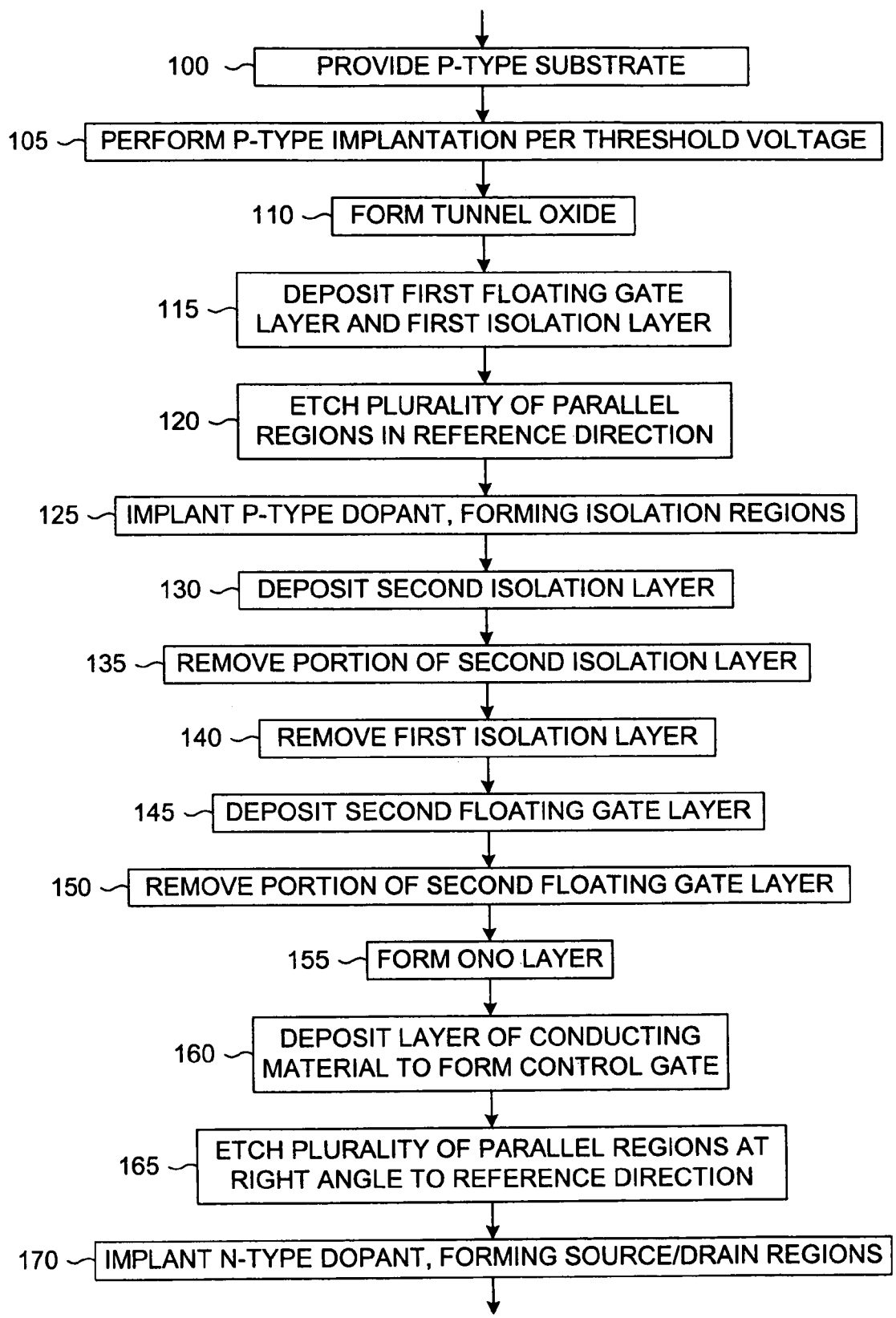
FIG. 1 is a flow diagram that outlines fabrication of a floating gate EEPROM array according to an exemplary implementation of the method of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of NAND-type EEPROM arrays. The present invention may be practiced in conjunction with various integrated circuit fabrication techniques that are conventionally used in the art, and only so much of the commonly practiced process steps are included herein as are necessary to provide an understanding of the present invention.

Figure 2:
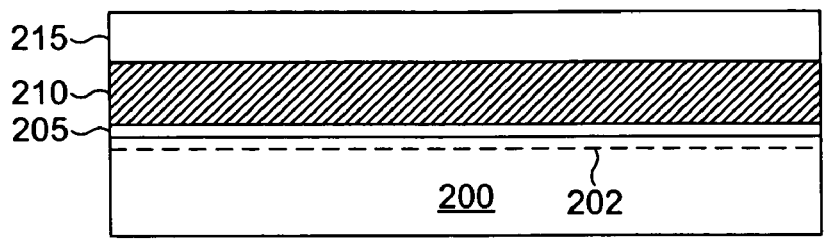
FIGS. 2-11 are cross-sectional views that illustrate steps of the implementation of the method described in FIG. 1.
Figure 3:
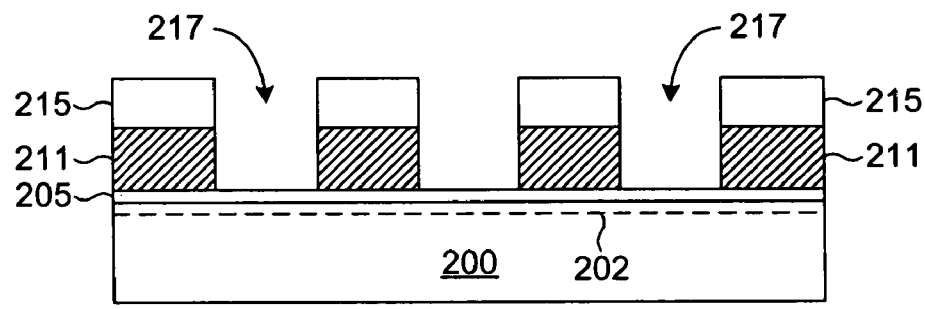
Figure 4:
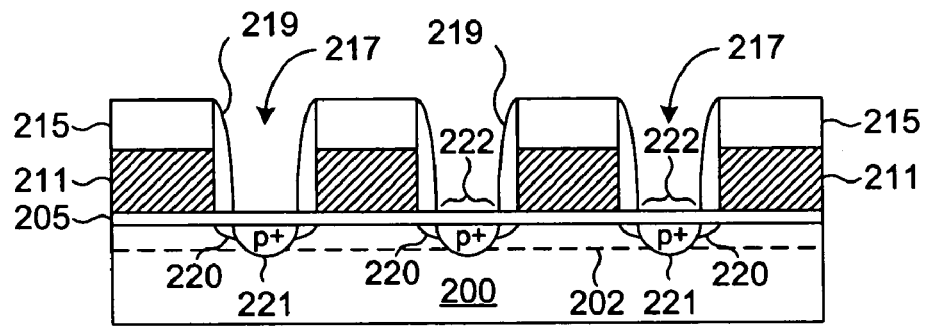

Referring more particularly to the drawings, FIG. 1 is a flow diagram that summarizes aspects of the present invention as applied to the fabrication of a NAND-type floating gate flash EEPROM array. Steps of the method summarized in FIG. 1 will now be described with reference to FIGS. 2-17A. Referring specifically to FIG. 2, a substrate 200 is provided at step 100. In a typical embodiment, the substrate 200 is formed of silicon that has been doped with a first impurity type. An implantation 202, also of the first impurity type, may be performed at step 105 for controlling a threshold voltage of memory cells to be formed on the substrate. The first impurity type, according to an exemplary embodiment, may comprise p-type material such as boron or indium. In an alternative embodiment, the first impurity type may comprise n-type material such as phosphorous or antimony. In the implementation described herein, the first impurity type comprises p-type material. A thin (typically 80 Å to 100 Å) tunnel oxide layer 205, which may comprise silicon dioxide, may be formed on the substrate at step 110. A first floating gate layer 210 and a first isolation layer 215 may be deposited at step 115. The first floating gate layer 210 may be formed of a film of n+ doped or undoped polysilicon. The first isolation layer 215 typically is formed of silicon nitride. The first isolation layer 215 then may be coated with photoresist, which may be patterned to define parallel regions in a reference direction, which may coincide with a bit line direction. The first isolation layer 215 and the first floating gate layer 210 then may be etched at step 120 to form a plurality of parallel regions 217 as illustrated in FIG. 3. The etching removes portions of the first isolation layer 215 and the first floating gate layer 210, thereby forming first floating gates 211. The parallel regions 217 are oriented in the reference direction (i.e., perpendicular to the plane of the page of the diagram of FIG. 3).

The etch process that forms the plurality of parallel regions 217 may include, for example, a two-step etching process performed in sequence. The first etch process may be a selective etch process (e.g., a dry plasma etch process) in which the etchant has a higher selectivity for nitride than for photoresist. The first etch process may remove material in the first isolation layer 215 (that may be formed of silicon nitride), using photoresist as a mask. A second etch process may be a selective etch process (e.g., a dry plasma etch process) in which the etchant has a higher selectivity for silicon than for photoresist. The second etch process may remove material in the first floating gate layer 210 (that may be formed of polysilicon), likewise using photoresist as a mask. Remaining photoresist material then may be removed.

Formation of the plurality of parallel regions 217 exposes the thin tunnel oxide layer 205 in those regions. A first impurity type dopant, which in the illustrated embodiment is a p-type dopant, may then be implanted through the exposed portions, i.e. strips, of the thin tunnel oxide layer 205 into the substrate 200 at step 125. This implantation, which is self-aligned to the strips of the exposed tunnel oxide layer 205, forms p-type electrical isolation regions. It should be noted that the impurity type of the isolation regions is opposite to that of the drain/source regions described infra. According to an illustrative embodiment depicted in FIG. 4, the implantation of the p-type dopant is carried out using a two-step process. In the first step, a lightly-concentrated p-type dopant, such as boron or indium, is implanted to form a p-implantation 220. Then a relatively thin spacer layer 219, which may be formed of, for example, silicon dioxide or silicon nitride, is deposited or thermally grown on the tunnel oxide layer 205 and on sidewalls of the plurality of parallel regions 217. A second, heavier implantation, with higher concentration of a p-type dopant, such as boron or indium, i.e. a p+ implantation 221, is then performed to form p+ isolation regions 222. The p− implantation 220 can provide suitable isolation between NAND strings and can provide a higher junction breakdown between a plurality of source/drain regions (typically implemented by n+ implantations as described below) and the plurality of p+ isolation regions 222. This higher junction breakdown may prevent junction leakage during programming of memory cells. In a modified embodiment, only a single implantation of the first impurity type (the p+ implantation 221 in the present instance) may be implemented.

Figure 5:
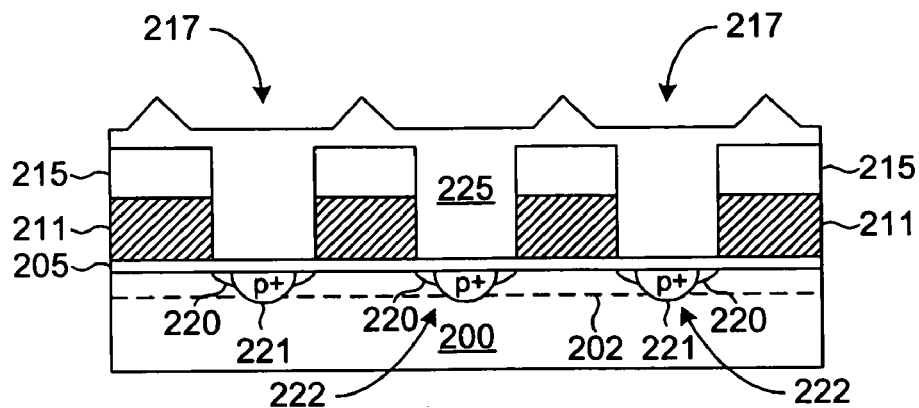
Figure 6:
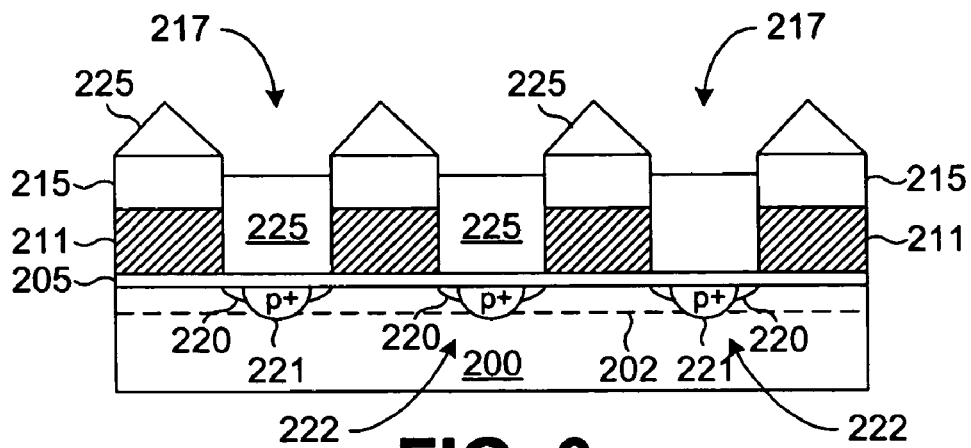
Figure 7:
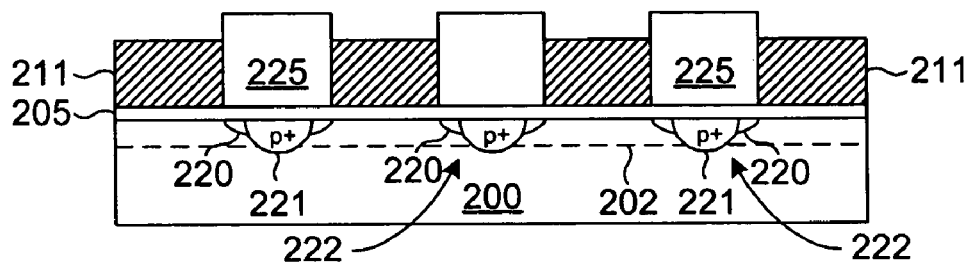

At step 130 a second isolation layer 225 is deposited, covering the first isolation layer 215 and the exposed portion of tunnel oxide layer 205 in the plurality of parallel regions 217 as shown in FIG. 5. According to an illustrative embodiment, the second isolation layer 225 comprises high density plasma (HDP) oxide. A portion of the second isolation layer 225 is then removed at step 135. An exemplary method of removal of the portion of the second isolation layer 225 comprises etching back by performing an oxide dip sufficient to expose a surface of the first isolation layer 215, the result of which is illustrated in FIG. 6. Chemical mechanical polishing (CMP) may be employed on the structure of FIG. 5 in another embodiment to remove a portion of the second isolation layer 225 and expose a surface of the first isolation layer 215. Subsequently, the first isolation layer 215 may be removed at step 140 using for example a lift-off process in which a wet etch is performed using an etchant having a greater selectivity for the first isolation layer 215 than for the second isolation layer 225, resulting in the structure shown in FIG. 7.

Figure 8:
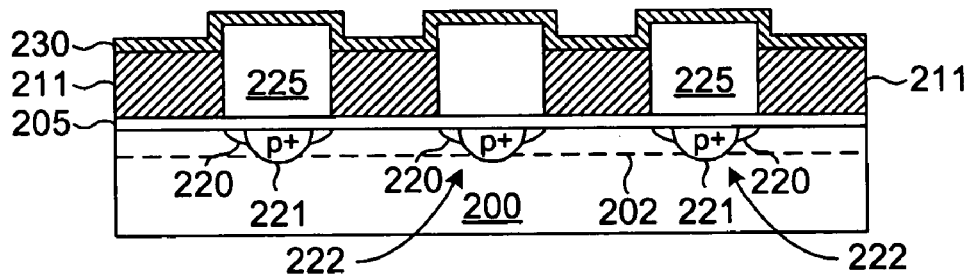
Figure 9:
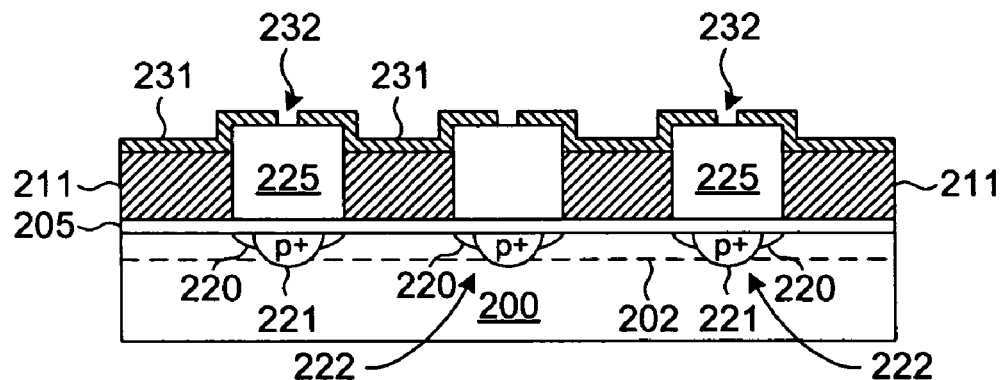

With reference to FIG. 8, a second floating gate layer 230, which may be formed of a film of doped or undoped polysilicon, is then deposited over the first floating gates 211 and the remaining second isolation layer 225 at step 145. The second floating gate layer 230 is then covered with a patterned photoresist and etched to remove a portion 232 (FIG. 9) of the second floating gate layer 230 disposed above the second isolation layer 225 at step 150. The removal of portion 232 forms second floating gates 231 as shown in FIG. 9. The second floating gates 231 are electrically connected to and extend beyond the edges of the first floating gates 211. Together, the first floating gates 211 and second floating gates 231 form composite floating gates having an increased effective size and gate coupling ratio compared to the size and gate coupling ratio of the first floating gates 211. This increased effective size and gate coupling ratio may improve the performance of the resulting memory cells.

Figure 10:
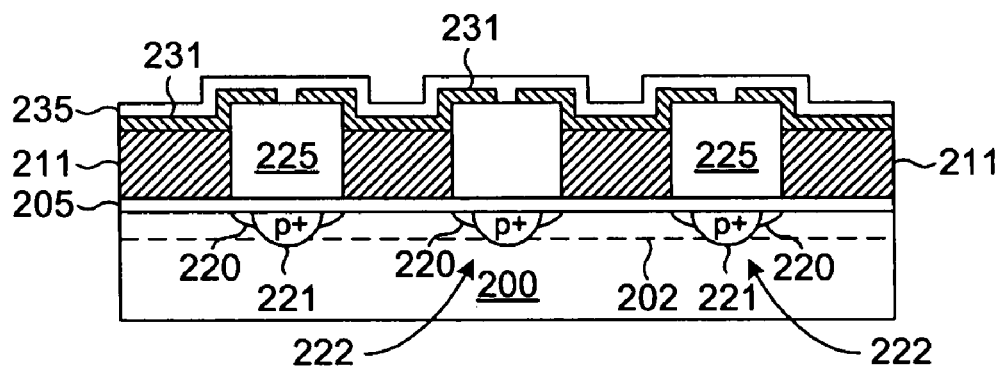
Figure 11:
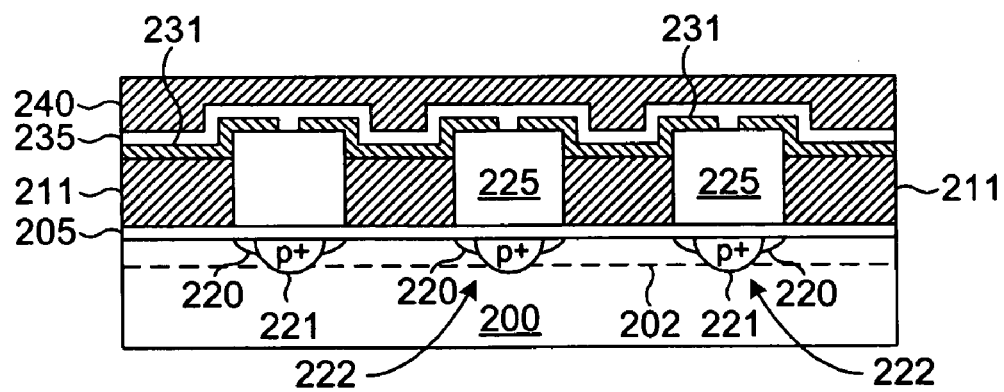

An interlayer dielectric, which as presently embodied may comprise an oxide-nitride-oxide (QNO) layer 235 as shown in FIG. 10, is then formed above the second floating gates 231 and the exposed portion of the second isolation layer 225 at step 155. Typically, formation of the ONO layer 235 comprises depositing a layer of oxide material, which may comprise silicon dioxide. A layer of nitride material, which may comprise silicon nitride, is deposited over the oxide, and another oxide layer, which also may comprise silicon dioxide, is formed over the nitride layer. A layer of conducting material, which may be formed of polysilicon, then is deposited on the ONO layer 235 at step 160 to form a control gate layer 240 as shown in FIG. 11. The ONO layer 235 operates as an isolation dielectric between the control gate layer 240 and the floating gates formed by the second floating gates 231 and the first floating gates 211. A re-oxidation process may be performed to remove etching damage.

Figure 17A:
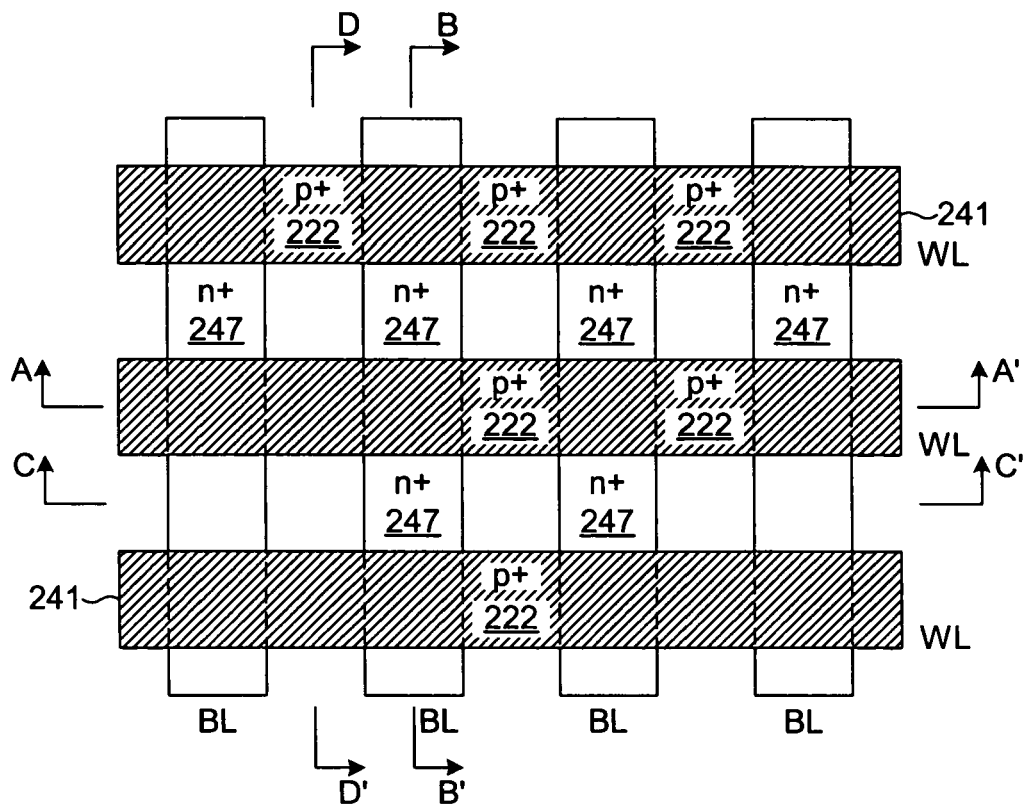
FIG. 17A is a plan view of an embodiment of a floating gate EEPROM array fabricated according to the present invention.

The preceding cross-sectional views of FIGS. 2-11 are taken along a line corresponding to line A-A' in FIG. 17A. The following cross-sectional views of FIGS. 12-15A are taken along a line corresponding to line B-B' nominally perpendicular to line A-A' in FIG. 17A.

Figure 12:
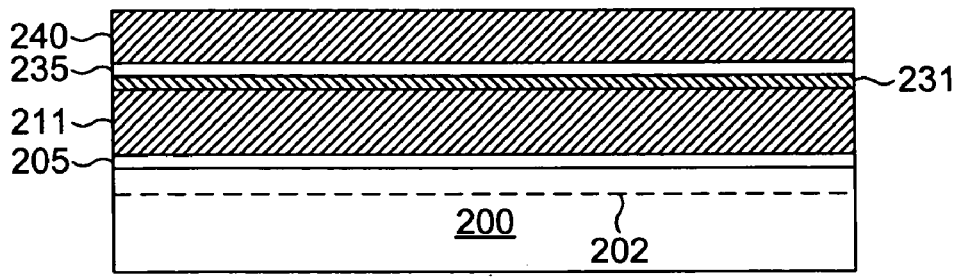
FIGS. 12-16 are alternative cross-sectional views illustrating additional steps of the implementation of the method described in FIG. 1.
Figure 13:
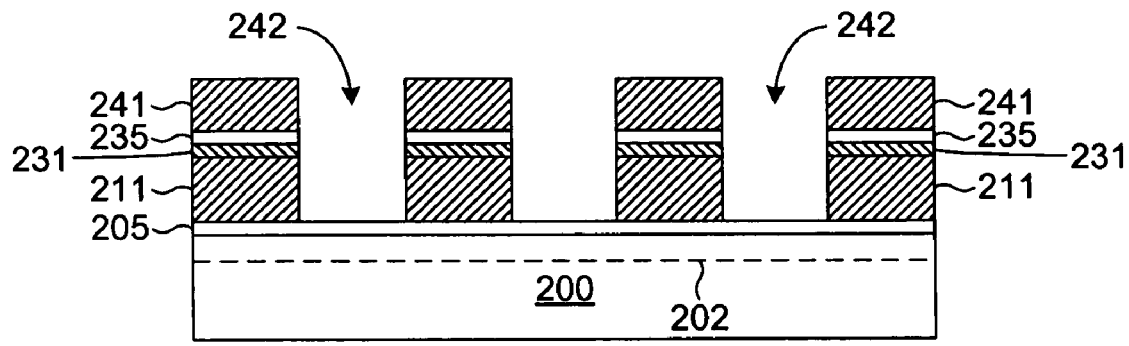

The cross-sectional depiction of FIG. 12 shows the result of performing steps 100-160 of the exemplary method described above when viewed along the line B-B'. Following formation of the structure of FIGS. 11 and 12, the control gate layer 240 may be covered with patterned photoresist and etched at step 165 to form a plurality of parallel regions 242 that expose the tunnel oxide layer 205 as shown in FIG. 13. The parallel regions 242 are oriented in a direction substantially perpendicular to the reference direction. The etch process that forms the parallel regions 242 may comprise, for example, a multi-step etch process in which each step of the etch process is a selective etch process that removes one or more layers of material from the parallel regions 242. For example, the first etch process may be a selective etch process in which the etchant has a higher selectivity for silicon than for photoresist. The first etch process may remove material in the control gate layer 240, thereby forming word lines 241 described more fully infra with reference to FIGS. 17A and 17B. A second etch process may be a selective etch process in which the etchant has a higher selectivity for oxide than for photoresist. The second etch process may remove material in an upper oxide layer of the ONO layer 235. Similar successive etch processes may be used to remove portions of the remainder of the ONO layer 235, the second floating gates 231, the second isolation layer 225, and the first floating gates 211 until the tunnel oxide layer 205 is exposed.

Figure 14:
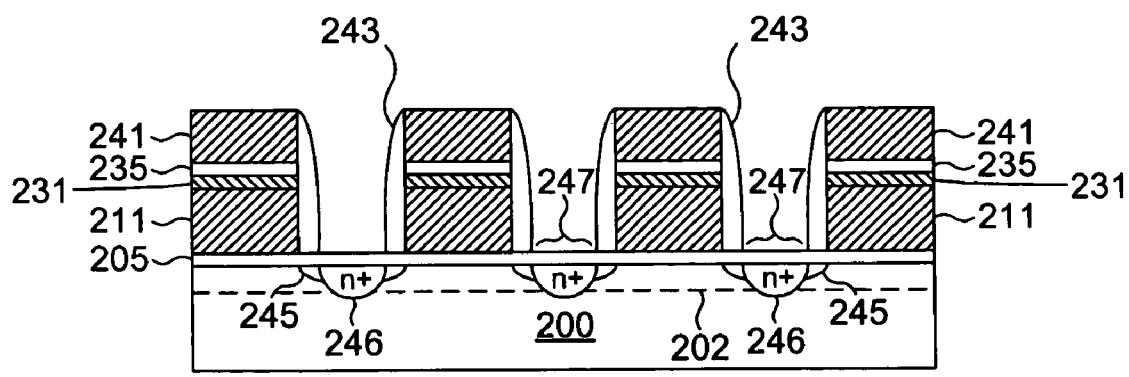
Figure 15A:
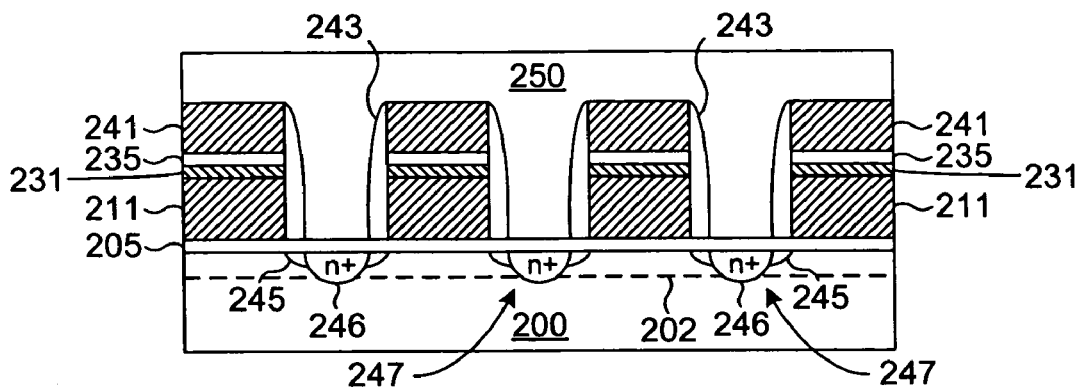
Figure 15B:
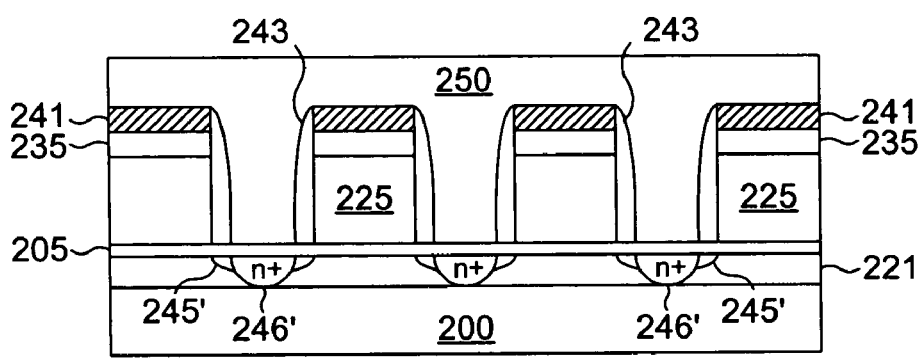
Figure 16:
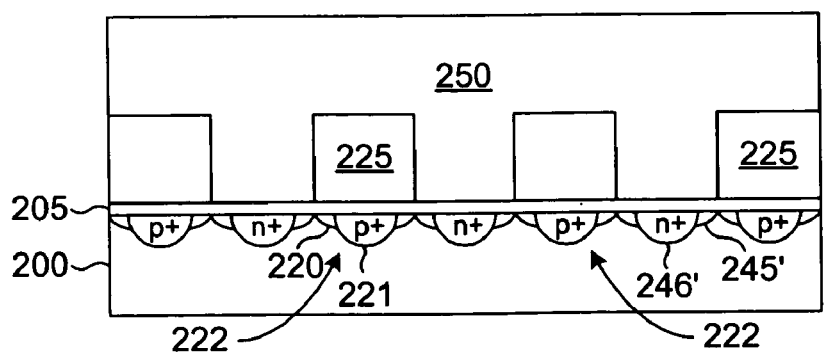

With the tunnel oxide layer 205 exposed, a second impurity type implantation, which as presently embodied comprises an n-type implantation, may be performed at step 170 to form a plurality of source/drain regions 247 in the substrate 200 under the exposed portions of the tunnel oxide layer 205 as shown in FIG. 14. An embodiment of the n-type implantation step, which may implant an n-type material such as phosphorous or antimony, may comprise a two-step implantation process. According to this embodiment, a lightly-concentrated n-type implantation, i.e. an n− implantation 245, is performed after formation of the parallel regions 242. The first implantation step, i.e., the n− implantation 245, may act to reduce junction leakage. Following the n− implantation step, a thin silicon nitride or oxide film or layer may be grown or deposited to form a relatively thin spacer (e.g., silicon nitride or oxide) layer 243. Then a heavy n-type implantation, i.e. an n+ implantation, is performed. The n+ implantation step may act to reduce resistance of the source/drain regions 246. Interlayer dielectric material 250 may be deposited over the structure at the conclusion of the aforementioned steps of the method as shown in FIG. 15A. Another cross-section, taken along line D-D' of FIG. 17A is illustrated in FIG. 15B, wherein the regions 245' and 246' comprise the n− and n+ implantations, respectively, formed over the p+ isolation regions 222 (FIG. 11). In a modified embodiment, only a single implantation, e.g. the n+ implantation 246, of the second impurity type may be implemented. FIG. 16 illustrates yet another cross-section taken along line C-C' of FIG. 17A.

Figure 17B:
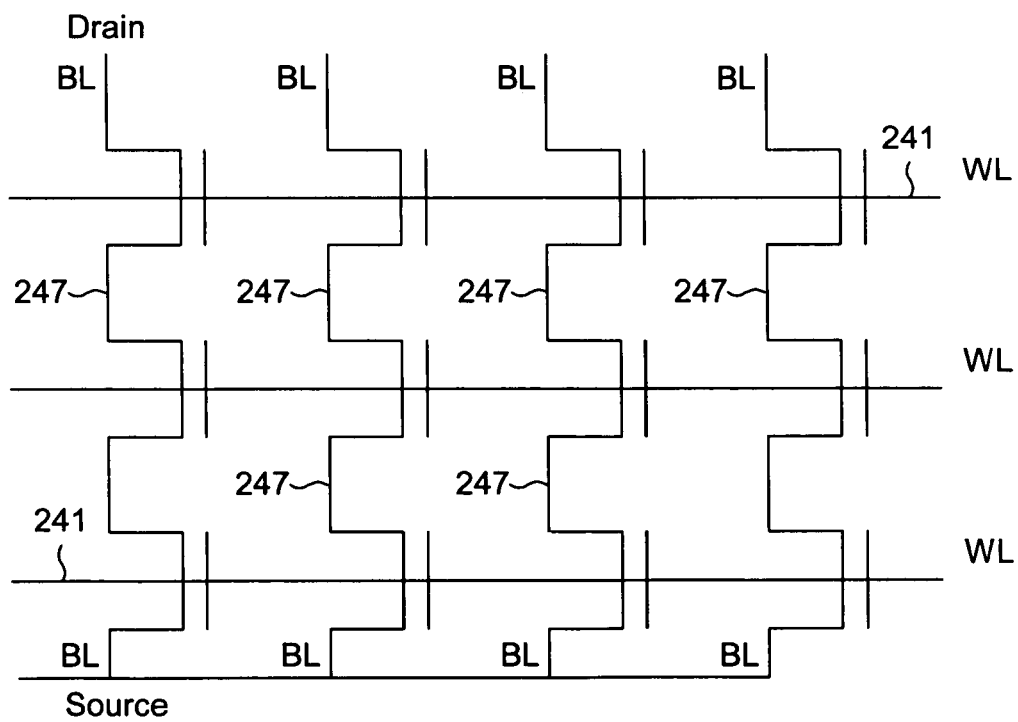
FIG. 17B is a schematic equivalent of the embodiment of the floating gate EEPROM array illustrated in FIG. 17A.

FIG. 17A is a plan view of an exemplary result of performing the above-described steps. The figure illustrates word lines 241 and source/drain regions 247. A schematic diagram of the circuit equivalent of the structure illustrated in FIG. 17A is shown in FIG. 17B. Horizontal structures labeled WL in FIG. 17A represent control gates or word lines 241. Vertical structures labeled BL represent series-connected transistors that share sources and drains designated in the diagram as n+ 247 (cf. FIG. 15A). That is, these vertical structures comprise NAND strings. Individual memory cells, which also comprise floating gates, generally reside at the intersections of word lines WL 241 and pairs of bit lines BL. Isolation between NAND strings is provided by the regions designated as p+ 222 (cf. FIG. 11) and by p+ implanted areas between vertical pairs of implanted regions p+ 222 (cf. FIG. 16). No shallow trench isolation (STI) or field oxide isolation is required in this implementation. These features may enhance the suitability of the structures described herein to be used in high density flash EEPROM devices. Additionally, the tunnel oxide layer 205 has no STI edge or field oxide edge, so better reliability of memory devices can be achieved by applying the method of the present invention.

Figure 18:
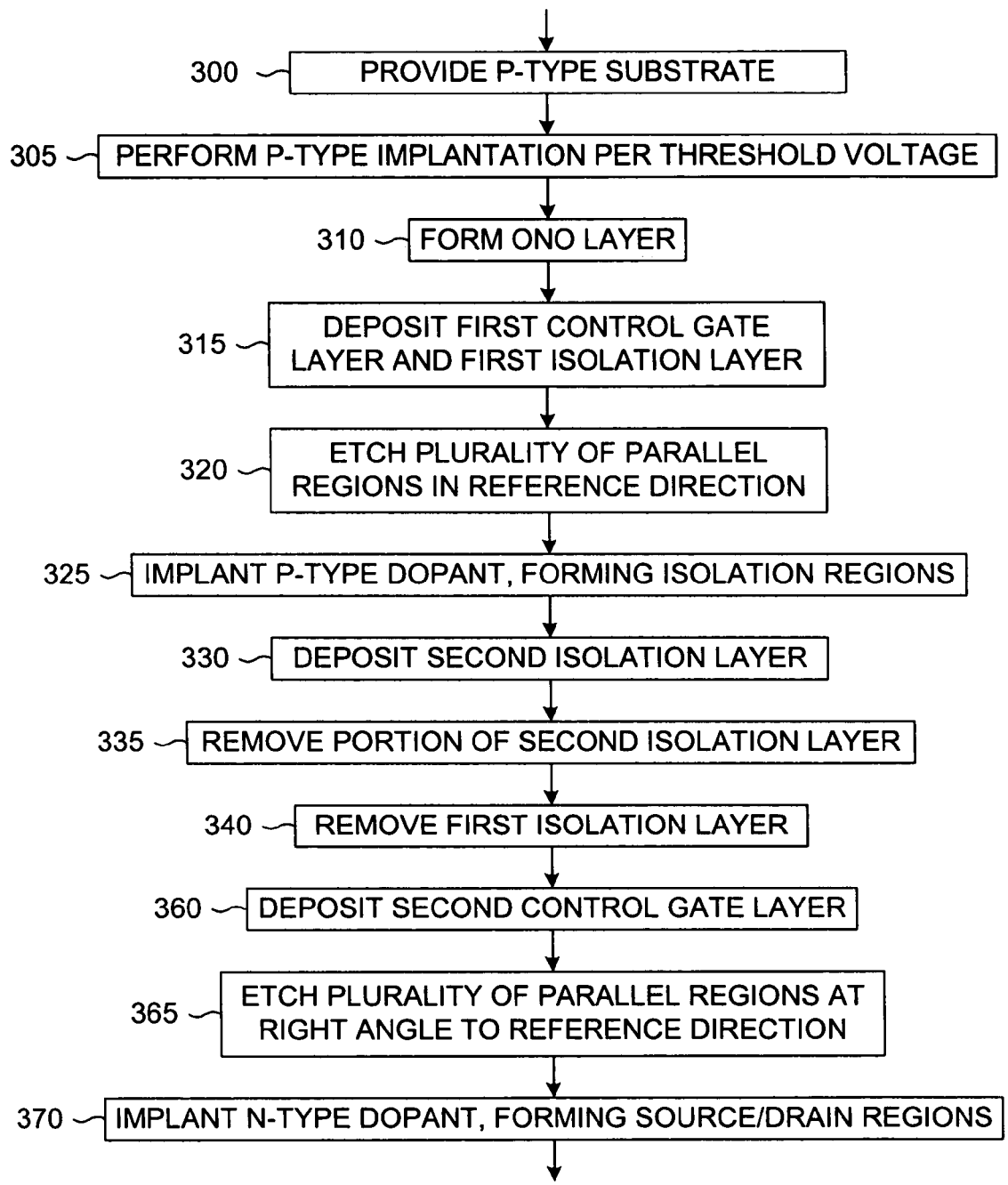
FIG. 18 is a flow diagram that outlines fabrication of a charge-trapping EEPROM array according to another exemplary implementation of the method of the present invention.
Figure 19:
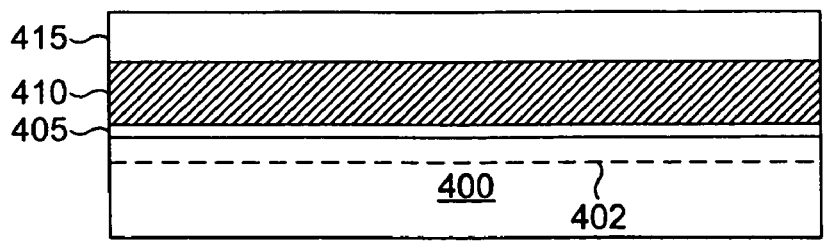
FIGS. 19-25 are cross-sectional views that illustrate steps of the implementation of the method described in FIG. 14.
Figure 20:
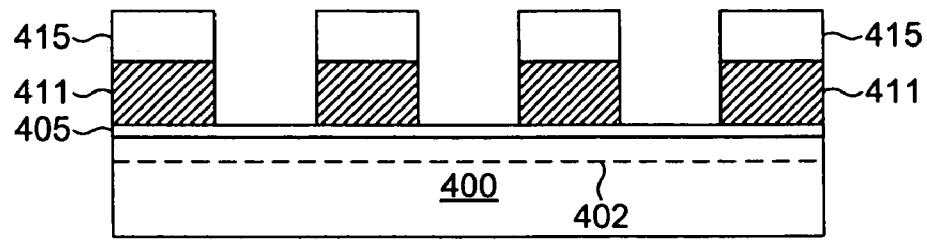
Figure 21:
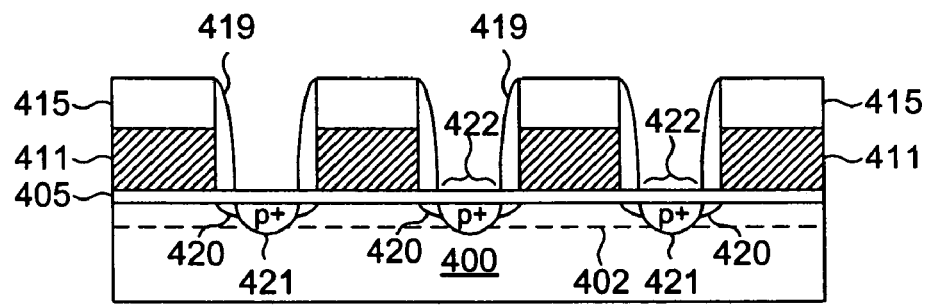
Figure 22:
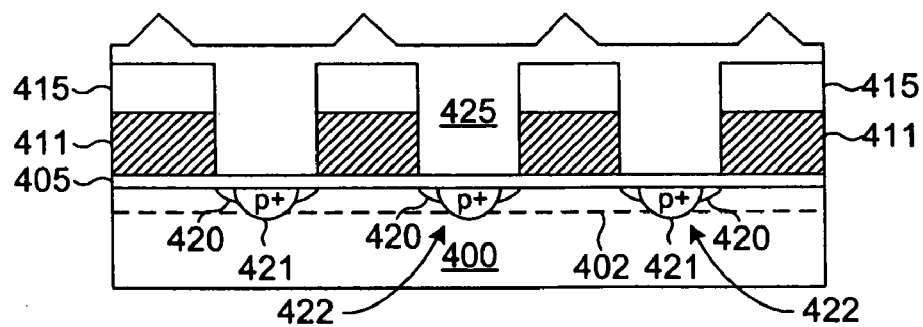
Figure 23:
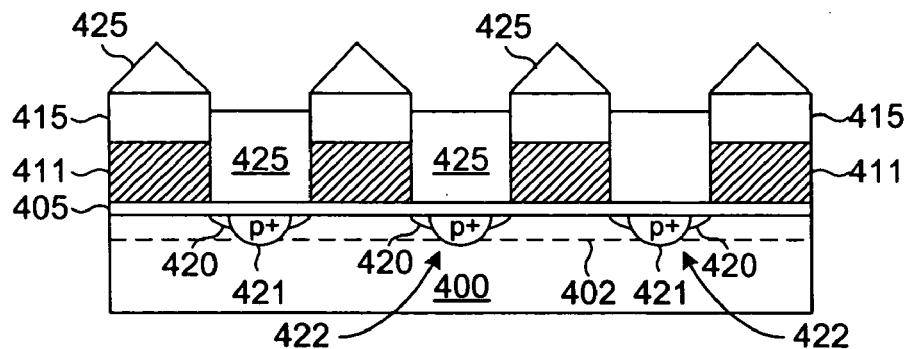
Figure 24:
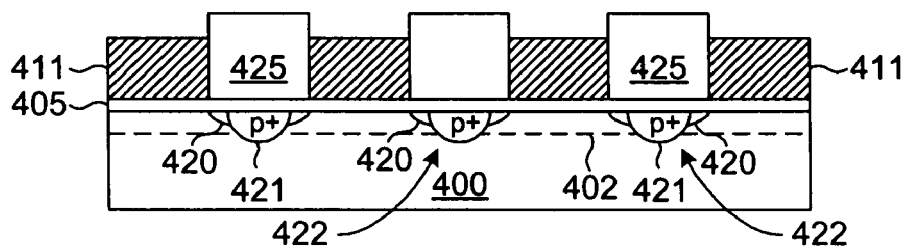

An alternative embodiment of a NAND-type EEPROM array, i.e. a silicon-ONO-silicon (SONOS) NAND flash EEPROM array, employing localized trapped charge storage is illustrated in FIGS. 18-32B. Elements having reference designators of the form 4xx in FIGS. 18-32B have a meaning corresponding to reference designators of the form 2xx in FIGS. 1-17B unless indicated otherwise. For instance, reference designators 420, 421, 425, and 443 in FIGS. 18-32B have descriptions that may be the same as, respectively, 220, 221, 225, and 243 in FIGS. 1-17B. An ONO layer may be used to store localized trapped charge in the embodiment described. The fabrication of this alternative embodiment may follow steps similar to those outlined for fabrication of the NAND-type floating gate EEPROM array as summarized in FIG. 1. An implementation of the inventive method for fabricating NAND-type localized trapped charge EEPROM arrays, which may employ, for example, ONO storage, is outlined in the flow diagram of FIG. 18. Referring additionally to FIG. 19, which is a cross-sectional view taken along line E-E' of FIG. 32A, a p-type substrate is provided at step 300, and a p-type implantation 402 is performed at step 305, steps 300 and 305 being similar to respective steps 100 and 105 of FIG. 1. An ONO layer 405 is then formed on the substrate 400 at step 310. A layer of conducting material, such as polysilicon, is deposited to form a first control gate layer 410, and a first isolation layer 415 is likewise deposited at step 315.

Figure 25:
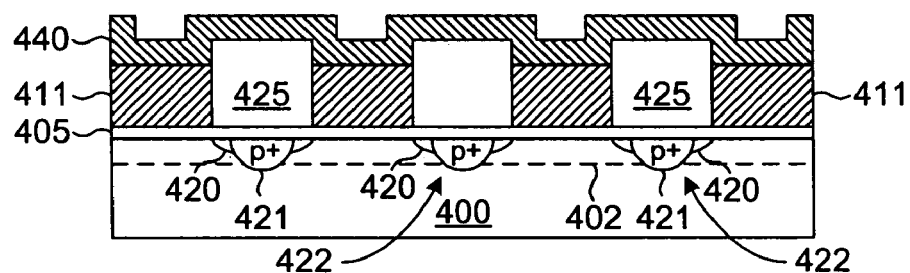
Figure 32A:
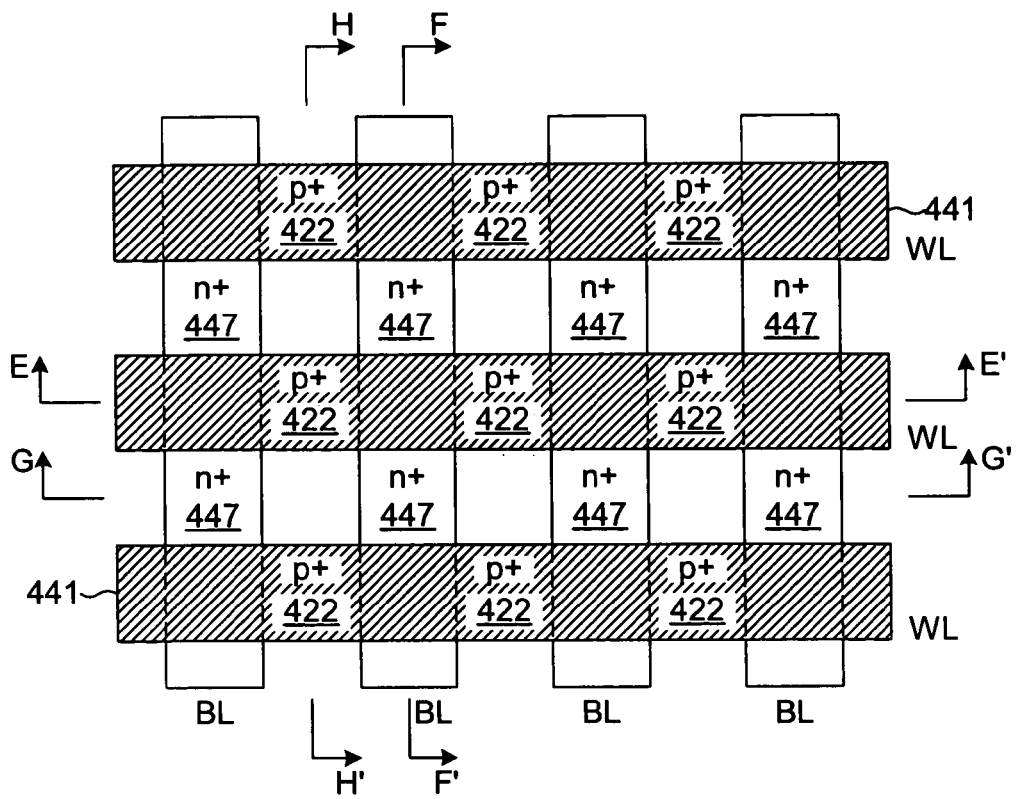
FIG. 32A is a plan view of an embodiment of a localized trapped charge EEPROM array fabricated according to the present invention.

Steps 320, 325, 330, 335, and 340 in the present implementation, and corresponding FIGS. 20-24, representing cross-sections taken along line E-E' of FIG. 32A, may be similar to corresponding steps 120, 125, 130, 135, and 140 described supra with reference to FIG. 1 and FIGS. 2-7. A layer of conducting material, which may be polysilicon in a representative embodiment, may be deposited at step 360 to form a second control gate layer 440 as illustrated in FIG. 25, which also is a cross-sectional view taken along line E-E' of FIG. 32A.

Figure 26:
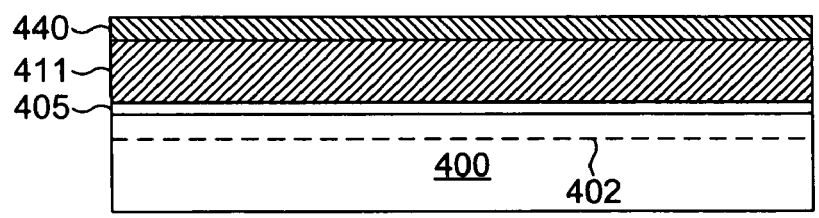
FIGS. 26-31 are alternative cross-sectional views illustrating additional steps of the implementation of the method described in FIG. 18.
Figure 27:
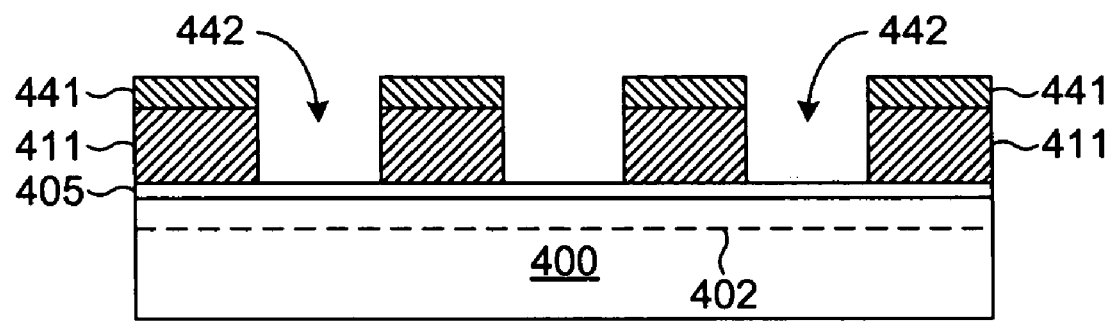
Figure 28:
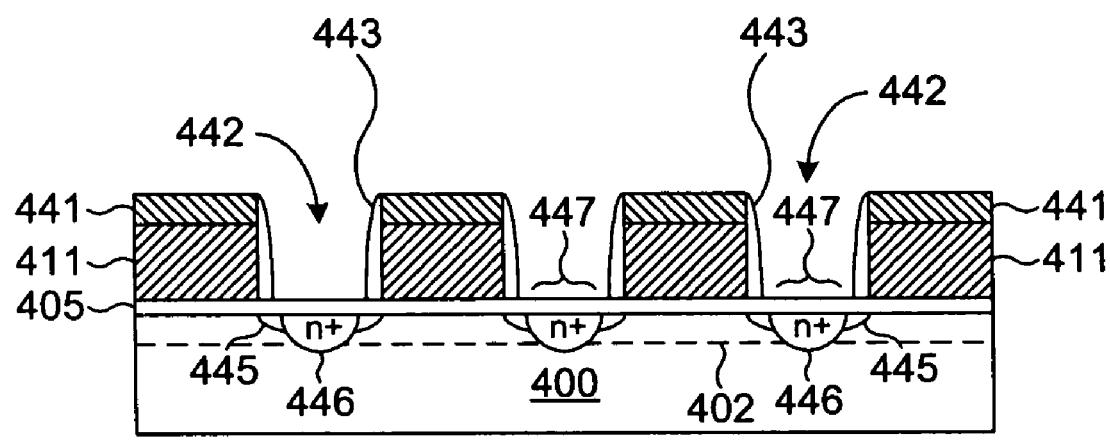
Figure 29:
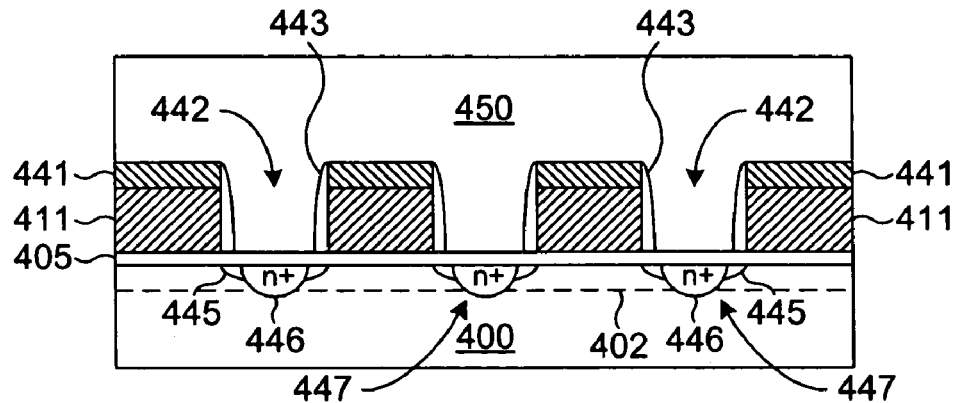
Figure 30:
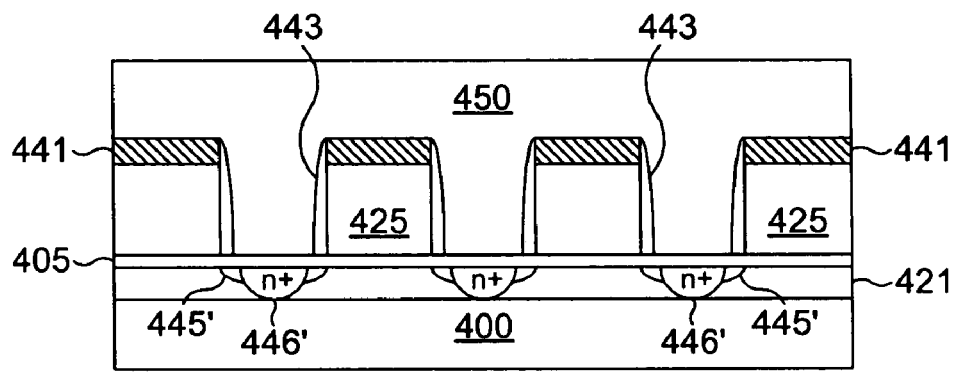
Figure 31:
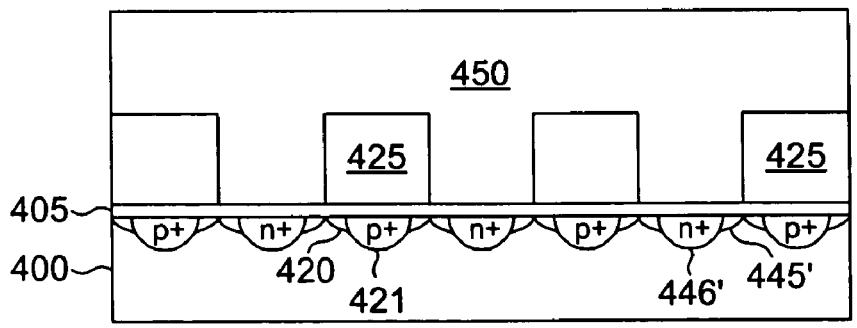
Figure 32B:
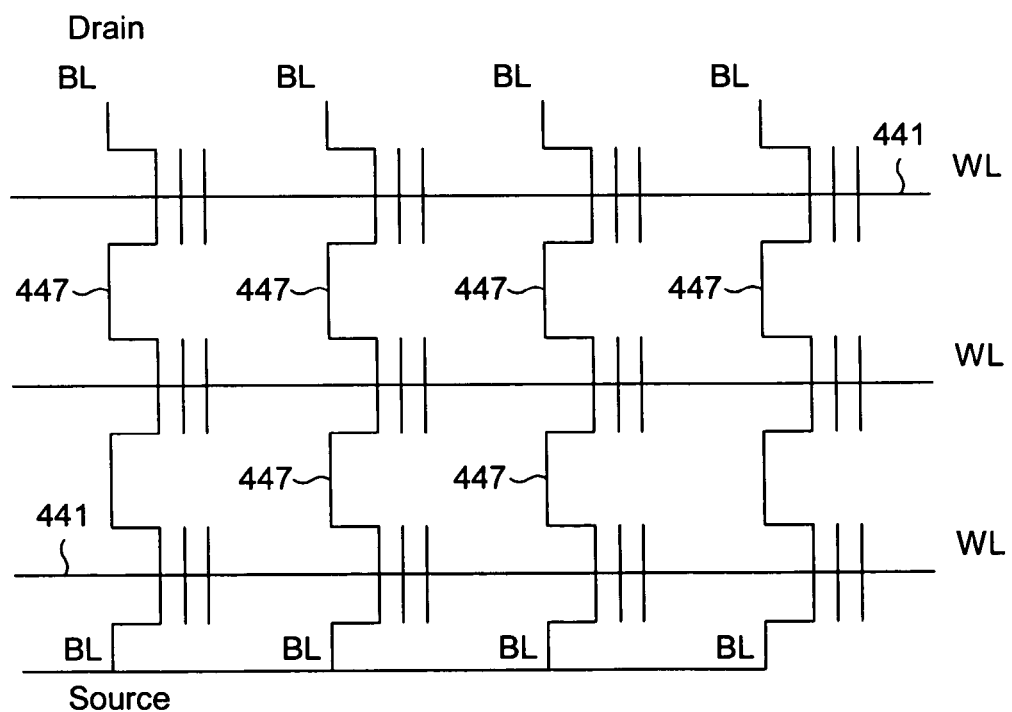
FIG. 32B is a schematic equivalent of the embodiment of the localized trapped charge EEPROM array fabricated according to the present invention.

The cross-sectional view illustrated in FIG. 26 is taken along line F-F' of FIG. 32A, as are the views of FIGS. 27-30. Continuing with the method, a plurality of parallel regions 442 shown in FIG. 27 is then formed at step 365 by forming a patterned photoresist over and etching the structure of FIG. 26. Creating the regions 442 forms control gates 411 from the first control gate layer 410 and word lines 441 from the second control gate layer 440. The etch process that forms the parallel regions 442 may include a two-step etch process analogous to that described above for forming the parallel regions 242 (FIG. 13). An n-type implantation 445, 446 may then be performed at step 370 to form source/drain regions 447. A two-step process similar to that described for forming the n-type source/drain regions 247 at step 170 of the earlier described method may be employed. An interlayer dielectric 450 then may be deposited to yield the structure of FIG. 29. Another cross-sectional view of this localized trapped charge embodiment of the NAND-type EEPROM array taken along the line H-H' of FIG. 32A is illustrated in FIG. 30. The areas designated as 445' and 446' comprise n− and n+ implantations, respectively, formed over the p+ isolation regions 422 (FIG. 25). FIG. 31 is a cross-section of the localized trapped charge NAND-type EEPROM array taken along line G-G' in FIG. 32A. FIG. 32A is a plan view of an exemplary result of performing the method steps summarized in FIG. 18. A schematic diagram of the circuit equivalent of the structure illustrated in FIG. 32A is shown in FIG. 32B.

In view of the foregoing, it will be understood by those skilled in the art that the methods of the present invention can facilitate formation of memory devices, and in particular memory devices not having field oxide, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of fabricating an NAND-type flash EEPROM, comprising;

providing a substrate doped with a first impurity type;

forming a tunnel oxide layer on the substrate;

depositing a first floating gate layer on the tunnel oxide layer;

depositing a first isolation layer on the first floating gate layer;

etching portion of the first isolation layer and portion of the first floating gate layer to form a plurality of parallel regions for exposing portions of the tunnel oxide layer, the parallel regions being oriented in a reference direction;

implanting a dopant of the first impurity type through the exposed portion of tunnel oxide layer into the substrate, thereby forming a plurality of parallel electrical isolation regions in the substrate; and depositing a second isolation layer to cover the first isolation layer and the exposed portions of the tunnel oxide layer.

2. The method as set forth in claim 1, further comprising:

removing a portion of the second isolation layer that overlies the first isolation layer;

removing the first isolation layer;

depositing a second floating gate layer on the first floating gate layer and the remaining second isolation layer; and removing a portion of the second floating gate layer that overlies the second isolation layer, thereby exposing a portion of the second isolation layer.

3. The method as set forth in claim 2, further comprising:

forming an oxide-nitride-oxide (ONO) layer on the second floating gate layer and the exposed portion of the second isolation layer;

depositing a layer of conducting material on the ONO layer to form a control gate layer; and performing a re-oxidation process on the layer of conducting material.

4. The method as set forth in claim 1, further comprising implanting a dopant of a second impurity type into the substrate under the exposed portions of the tunnel oxide layer, thereby forming a plurality of source/drain regions.

5. The method as set forth in claim 4, wherein the implanting of a dopant of the first impurity type comprise:

performing a light concentration implanting;

forming a relatively thin spacer layer; and performing a heavy implantation;

wherein the light concentration implantation acts to increase a junction breakdown between the plurality of source/drain regions and the plurality of isolation regions, thereby preventing junction breakdown while programming and reducing junction leakage.

6. The method as set forth in claim 4, wherein the implanting of a dopant of the second impurity type comprises:

performing a light concentration implantation after the etching of a plurality of parallel regions in the layer of conducting material, the light concentration implantation acting to reduce junction leajage;

depositing a relatively thin spacer material; and performing a heavy implantation, the heavy implantation acting to reduce source/drain resistance.

7. The method as set forth in claim 1, wherein the providing of a substrate is followed by performing an implantation of the first impurity type into the substrate, the implantation being controlled according to a desired threshold voltage.

8. The method as set forth in claim 1, wherein: the depositing of a second isolation layer comprises depositing high density plasma oxide; and the depositing of a second floating gate layer comprises depositing one of a film of doped polysilicon and a film of undoped polysilicon.

9. The method as set forth in claim 3, wherein the depositing of a layer of conducting material comprises depositing a layer of polysilicon, and wherein the method further comprises etching a plurality of parallel regions of the control gate layer, the ONO layer, the second floating gate layer, the first floating gate layer, and the second isolation layer to expose a plurality of parallel regions of the tunnel oxide layer, the exposed plurality of parallel regions of the tunnel oxide layer being oriented in a direction substantially at a right angle to the reference direction.

* * * * *